United States Patent [19]
Azad et al.

[11] Patent Number: 5,698,273
[45] Date of Patent: Dec. 16, 1997

[54] ELECTRON BEAM PHYSICAL VAPOR DEPOSITION METHOD

[75] Inventors: Farzin Homayoun Azad, Clifton Park; David William Skelly, Burnt Hills, both of N.Y.; David Vincent Rigney, Cincinnati, Ohio

[73] Assignee: General Electric Company, Schenectady, N.Y.

[21] Appl. No.: 562,484

[22] Filed: Nov. 24, 1995

[51] Int. Cl.$^6$ ........................................... B05D 3/06
[52] U.S. Cl. .................. 427/566; 427/567; 427/124; 427/126.1
[58] Field of Search .................... 427/566, 567, 427/124, 126.1

[56] References Cited

U.S. PATENT DOCUMENTS

| | | | |
|---|---|---|---|
| 5,296,274 | 3/1994 | Movchan et al. | 427/566 |
| 5,418,003 | 5/1995 | Bruce et al. | 427/126.2 |
| 5,436,035 | 7/1995 | Lohwasser | 427/525 |

*Primary Examiner*—Roy V. King
*Attorney, Agent, or Firm*—Tyler Maddry; Donald S. Ingraham

[57] ABSTRACT

A method is disclosed for operating an electron beam physical vapor deposition apparatus including a vacuum chamber containing an ingot disposed in a crucible, a workpiece disposed above the ingot, and an electron gun for emitting an electron beam to melt and vaporize the ingot to disperse vapors for deposition coating of the workpiece. The method includes directing a primary electron beam with a primary beam focus in a primary scanning pattern across a top surface of the ingot to melt and vaporize the ingot and develop an ingot melt pool floating atop an underlying ingot substrate. A secondary electron beam is superimposed across the ingot top surface in conjunction with the primary electron beam. The secondary electron beam has a secondary beam focus in a secondary scanning pattern to locally and transiently increase vaporization rate of the melt pool.

12 Claims, 3 Drawing Sheets

ELECTRON BEAM PHYSICAL VAPOR DEPOSITION METHOD

BACKGROUND OF THE INVENTION

The present invention relates generally to electron beam manufacturing processes, and, more specifically, to electron beam physical vapor deposition of a workpiece.

Electron beams are typically used in manufacturing processes to provide heat for cutting, welding, and vapor deposition. In conventionally known electron beam physical vapor deposition (EB-PVD), the electron beam is used to melt the surface of a suitable ingot material, such as zirconia, in a vacuum chamber containing a workpiece, with resulting zirconia vapors being dispersed for coating the workpiece. Zirconia is a thermally insulating ceramic material which finds use in gas turbine engines, for example, in which components such as combustor liners, shrouds, and airfoils are subject to hot combustion gases, with the zirconia coating being used for effectively thermally insulating these components for increasing useful life thereof.

The zirconia ingot must be uniformly and effectively heated and melted by the electron beam for maintaining stability of the resulting melt pool at the top thereof and for maximizing vaporization rate for coating the workpieces as quickly as possible. The rate of melting and vaporization of the ingot and the melt pool stability are controlled by key operating beam parameters including beam power, focus, scanning pattern, scanning frequency, and incidence angle of the electron beam on the target ingot. Various scanning patterns of the electron beam over the surface of the target are known and include for example simple linear rastering, or two radially spaced apart concentric scan circles each having a specific beam focus and scanning frequency. The beam focus is defined or characterized by a Gaussian radius which is the radial distance from the beam centerline to where the energy density of the beam drops in value to 1/e of its peak value at the centerline.

In an exemplary arrangement, an ingot having an outer diameter of about 63.5 mm is suitably supported in a water cooled copper crucible, with a conventional electron beam gun being operated to effect the two-circle beam pattern on the target surface. The target absorbs heat from the electron beam and develops a melt pool on the surface thereof. The distribution of the vaporization rate on the pool surface is controlled by the vapor pressure of the ingot material at the prevailing surface temperature of the melt pool. The magnitude and distribution of the melt pool temperature is determined by the operating beam parameters, as well as thermophysical properties of the ingot material and the various modes of heat transfer encountered.

In order to qualify the EB-PVD process for a specific workpiece, trial and error is typically used to adjust the several operating beam parameters until a suitably high vaporization rate, and corresponding deposition rate on the workpiece, is obtained with acceptable melt pool stability. The desired melt pool surface temperature distribution or profile is usually relatively uniform from the center of the ingot to its circumference with the temperature smoothly and rapidly decreasing in magnitude upon reaching the relatively cool region adjacent to the crucible.

The electron beam focus is a key parameter which affects the melting and vaporization rate of the ingot and melt pool stability. Beam focus is conventionally controlled by varying the electrical current to focusing coils in the electron beam gun. Melt pool stability is a primary factor in obtaining acceptable vapor deposition of the workpiece. Gas bursts and liquid expulsion destroy the stability of the melt pool and limit the maximum vaporization rate in the EB-PVD process. These undesirable effects generally occur at local hot spots created by overlapping electron beam scan patterns, or by relatively narrow beam focus which concentrates energy. It is believed that the gas bursts initiate in the porous zirconia substrate beneath the melt pool.

In current practice, the vaporization rates are not maximum in order to prevent the onset of melt pool instability. The conventional operating beam parameters including beam power, focus, scanning pattern, scanning frequency, and incidence angle, are varied using conventional trial and error techniques in an attempt to maximize vaporization rate with acceptable melt pool stability. Since vaporization rate is proportional to the melt surface temperature, it is desirable to produce maximum surface heating while maintaining a stable and completely molten pool. It is also desirable to increase vaporization rate by better utilizing the available beam parameters for maintaining simplicity of the required apparatus therefor.

SUMMARY OF THE INVENTION

A method is disclosed for operating an electron beam physical vapor deposition apparatus including a vacuum chamber containing an ingot disposed in a crucible, a workpiece disposed above the ingot, and an electron gun for emitting an electron beam to melt and vaporize the ingot to disperse vapors for deposition coating of the workpiece. The method includes directing a primary electron beam with a primary beam focus in a primary scanning pattern across a top surface of the ingot to melt and vaporize the ingot and develop an ingot melt pool floating atop an underlying ingot substrate. A secondary electron beam is superimposed across the ingot top surface in conjunction with the primary electron beam. The secondary electron beam has a secondary beam focus in a secondary scanning pattern to locally and transiently increase vaporization rate of the melt pool.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DESCRIPTION OF THE PREFERRED EMBODIMENT(S)

Figure 1:
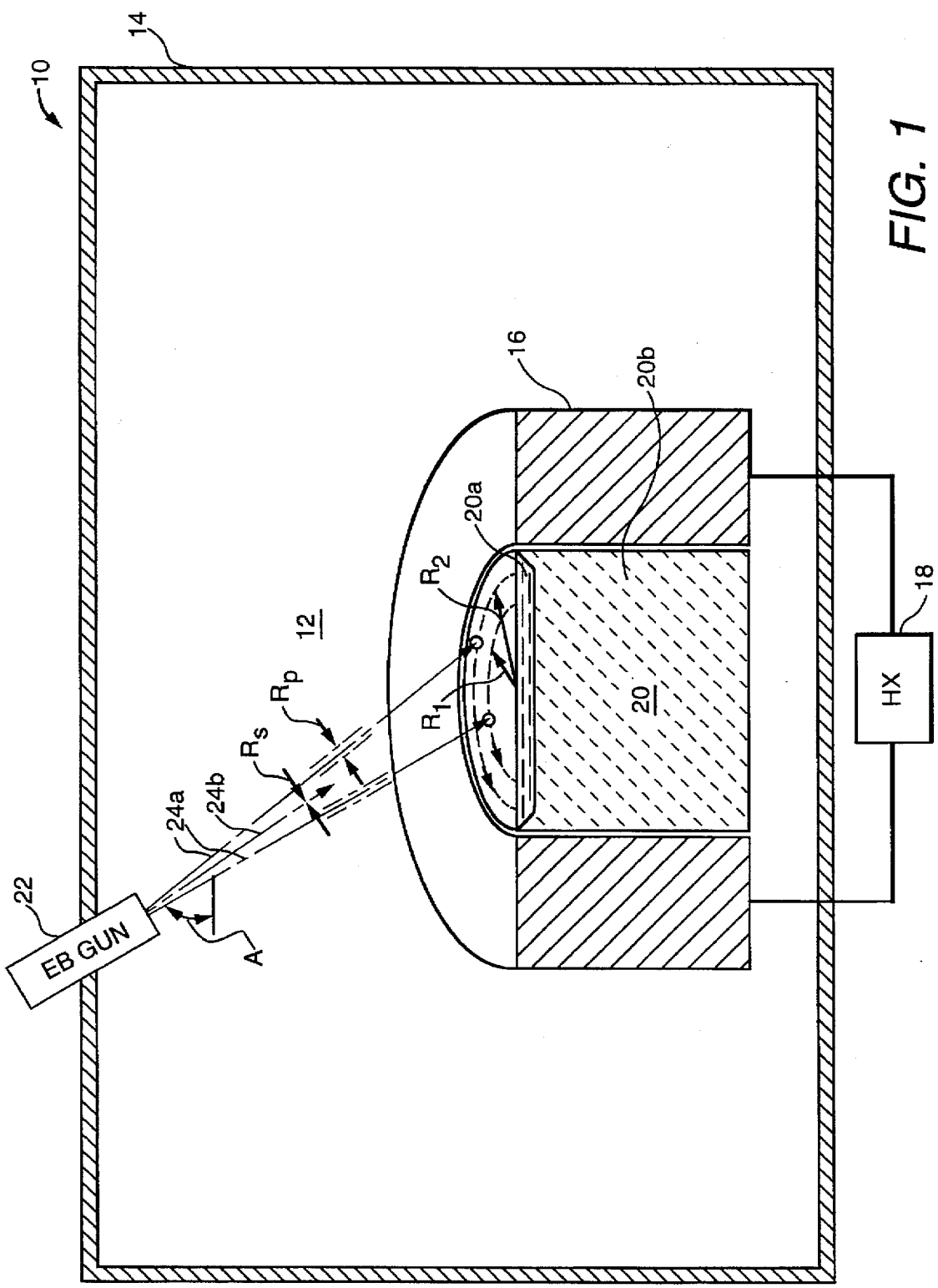
FIG. 1 is a schematic representation of an apparatus for effecting electron beam physical vapor deposition of a workpiece in accordance with one embodiment of the present invention for increasing vaporization rate therein.

Illustrated schematically in FIG. 1 is an electron beam physical vapor deposition (EB-PVD) apparatus 10 effective for depositing a vapor coating on an exemplary workpiece 12 in accordance with one embodiment of the present invention. The deposition apparatus 10 includes a working or vacuum chamber 14 in which is disposed a crucible 16 which is typically of metal construction and operatively joined with a cooling circuit 18 including a heat exchanger (HX) for example. Disposed in the crucible 16 is an ingot or target 20 formed of a desired feed material, such as zirconia, which is used for vapor deposition of the workpiece 12.

An electron beam gun 22 is suitably mounted to the chamber 14 for directing a primary electron beam 24a at the top surface of the target 20 for melting the surface and forming a shallow melt pool 20a which floats atop the unmolten solid substrate 20b therebelow.

The deposition apparatus 10 as described above is conventional in construction and operation. The electron beam gun 22 is represented schematically and conventionally includes various components for controlling its operation and the resulting primary electron beam 24a. Key operating parameters of the gun 22 include beam power, beam focus, beam pattern, scanning frequency of the pattern, and incidence angle A of the beam on the target 20.

Any suitable beam pattern and scanning frequency may be used, with a conventional two-circle primary scanning pattern being illustrated. The gun 22 is conventionally operated to form an inner scan circle of radius $R_1$ and a concentric outer scan circle of radius $R_2$. The inner circle is scanned at a suitable first frequency of about 300 hertz for example, and the outer circle is scanned at a second frequency of about 60 hertz for example. In this example, the target 20 has an outer diameter of about 63.5 mm, and the first radius $R_1$ is about 15.9 mm, and the second radius $R_2$ is about 31.8 mm.

As indicated above, a key parameter which is used in controlling the melting and vaporization rates of the target 20 and maintaining suitable melt pool stability is beam focus. The beam focus is defined or characterized by the Gaussian radius which is the radial distance from the beam centerline to the point where the energy density of the beam 24 drops to 1/e of the peak value at the centerline. The primary beam focus $R_p$ is the same for both the inner and outer scan circles, and is about 30 mm in this example. The primary beam focus is conventionally controlled by the specific value of the electrical current provided to conventional focusing coils in the gun 22 and may be varied as desired.

The electron beam gun 22 illustrated in FIG. 1 may be conventionally operated using the two-circle primary scanning pattern illustrated therein to effect a substantially uniform surface temperature distribution or profile of the melt pool 20a having a maximum value at the target longitudinal centerline axis and decreasing with a relatively small gradient radially outwardly therefrom up to the circumference of the target 20 wherein the temperature smoothly and rapidly decreases due to the cooling effects of the cooled crucible 16.

In accordance with the present invention as illustrated in FIG. 1, the electron beam gun 22 may be conventionally operated to emit and direct the primary electron beam 24a with a primary beam focus $R_p$ in the primary scanning pattern across the top surface of the ingot 20 to develop the shallow ingot melt pool 20a floating atop the underlying ingot substrate 20b. An exemplary primary scanning pattern is the concentric two-circle scan lines or paths illustrated in FIG. 1. The primary electron beam 24a including the primary scanning pattern are conventionally effective to develop the melt pool 20a at an average or bulk temperature for maintaining stability of the melt pool 20a without significant or excessive gas eruptions from the porous zirconia substrate 20b supporting the pool.

As indicated above, the primary beam 24a is typically operated below optimum maximum levels of vaporization rate to provide a sufficient margin against melt pool instability in which undesirable gas bursts and liquid expulsion would degrade the stability of the melt pool and render the deposition process ineffective.

In accordance with the present invention, analyses of the effects of the key operating beam parameters including beam power, focus, pattern, scanning frequency, and incidence angle, on the melt pool surface temperature distribution and vaporization rate were performed and provide the basis for an improved method of operating the apparatus 10 for increasing vaporization rate while still maintaining acceptable melt pool stability.

More specifically, the analyses performed provided a mathematical model of the EB-PVD process including the interrelationship between the beam parameters, thermophysical properties of the ingot material, and the various modes of heat transfer. The controlling heat transfer mechanisms in the deposition process include conduction in the melt pool 20a and in the substrate 20b therebelow. Buoyancy and surface tension driven heat convection in the melt pool have been found in accordance with the present invention to be significant factors. And, radiation heat transfer, and depending on pressure, convection heat transfer, from the melt pool surface and from the lateral surface of the ingot 20 are also factors.

The electron beam provides heat flux into the ingot 20, with the various modes of heat transfer distributing and dissipating the heat therefrom. At equilibrium operation, the heat flux into and out from the ingot 20 are substantially equal for maintaining a substantially constant bulk temperature of the melt pool 20a for effecting a corresponding vaporization rate with an acceptable margin of melt pool stability. In the exemplary primary scanning pattern introduced above, the primary beam 24a is scanned in the two concentric paths at 60 and 300 Hz, which correspond with 0.017 and 0.003 seconds for completing each cycle or period. The process model predicts that the time for heat diffusion or conduction over the 31.75 mm ingot radius is on the order of about 672 seconds, which is relatively slow. The time for heat diffusion or conduction over an exemplary 10 mm beam radius (using a diffusivity coefficient of about $1.5 \times 10^{-6}$ m$^2$/s) is about 67 seconds which is also relatively slow. The time constant for radiation cooling of the melt pool 20a having a typical thickness of about 1.5 mm at 3500° K. is about 4.2 seconds. And, and most significantly, the time for heat convection over the exemplary 10 mm beam radius at an exemplary melt surface or convection velocity of about 10 mm/second is about 1 second.

Accordingly, heat convection due to melt surface currents is the primary heat dissipating mechanism which is substantially faster than conduction and radiation cooling, and substantially slower than the time period for the scanning circles.

In accordance with the present invention, the analyses support the generation of a secondary electron beam designated 24b in FIG. 1 which is preferably superimposed across the top surface of the ingot or melt pool 20a in conjunction with the steady state primary electron beam 24a to locally and transiently increase the vaporization rate of the melt pool 20a without significantly decreasing the margin of melt pool stability.

Figure 2:
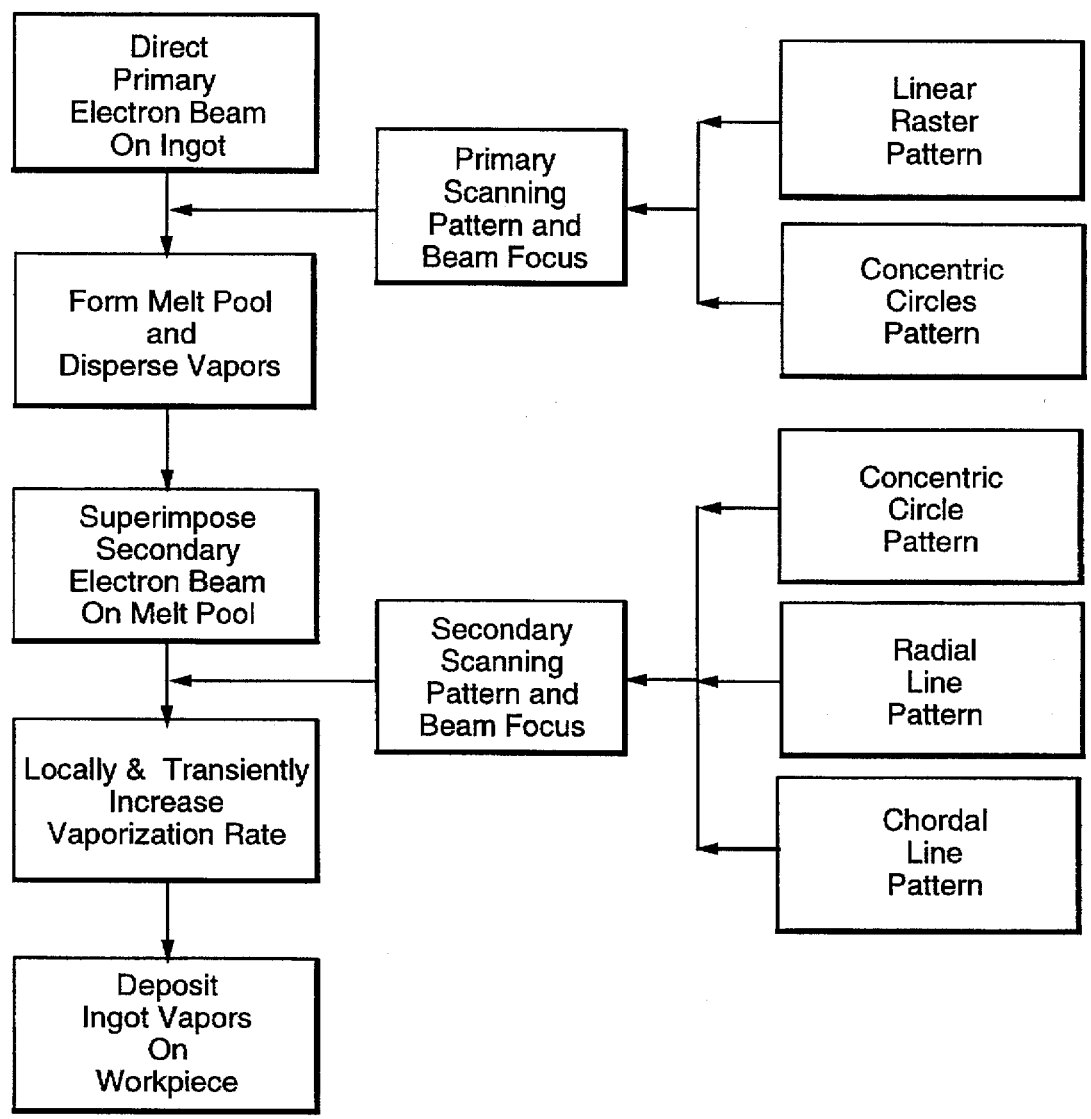
FIG. 2 is a flowchart representation of a method for operating the vapor deposition apparatus for increasing vaporization rate in accordance with an exemplary embodiment of the present invention.

FIG. 2 illustrates in flowchart form an exemplary embodiment of the present invention wherein the primary electron beam 24a is directed on the ingot 20 for initially forming the melt pool 20a for dispersing the vapors therefrom for coating the workpiece 12. The primary electron beam may have any suitable beam focus and scanning pattern, such as a conventional linear raster pattern or the concentric two-circle pattern disclosed above. The secondary beam 24b is superimposed on the melt pool 20a to locally and transiently increase the vaporization rate for improving the rate of deposition of the ingot vapors on the workpiece 12.

Figure 3:
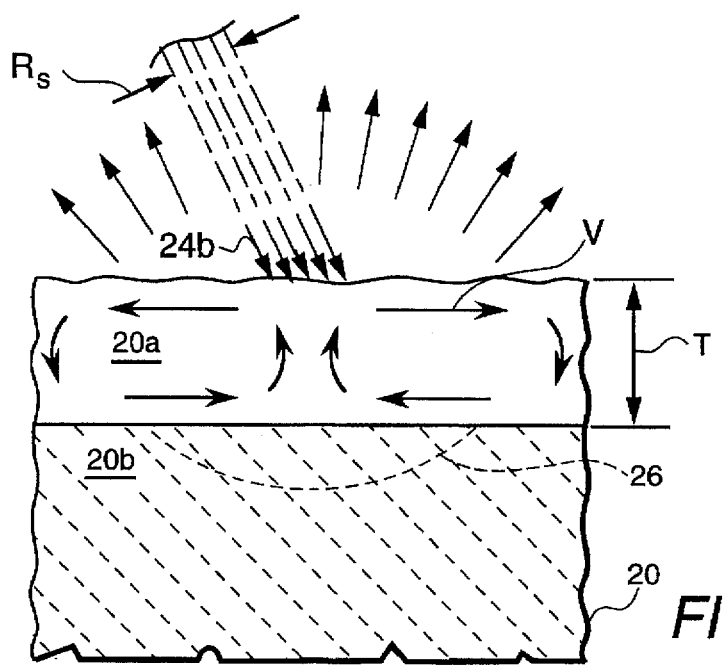
FIG. 3 is a schematic enlarged view of a portion of the melt pool floating atop the ingot shown in FIG. 1 illustrating an incidence secondary electron beam for locally and transiently increasing vaporization rate.

FIG. 3 is an enlarged schematic representation of a portion of the melt pool 20a having a nominal thickness T of about 1.5 mm which is initially created by the primary electron beam 24a. The secondary electron beam 24b is illustrated in FIG. 3 at a local spot, with the beam having a suitable secondary Gaussian beam focus $R_s$. The secondary electron beam 24b may be generated by the same electron beam gun 22 which generates the primary electron beam 24a provided sufficient cycle time is available for generating both beams. In an alternate embodiment, the secondary electron beam 24b may be generated from a separate electron beam gun which may be identical to the electron beam gun 22.

The operating beam parameters for generating the secondary electron beam 24b, including the secondary scanning pattern, are selected to effect or develop additional heat flux into the melt pool 20a locally in the vicinity of the incident beam at a preferably lower rate than heat flux is dissipated from the melt pool in each cycle to transiently increase temperature and vaporization rate in the melt pool along the secondary scanning pattern. The primary electron beam 24a is used to maintain a fully molten pool 20a across the entire ingot top surface, with a suitably low or limited temperature of the substrate 20b to prevent excessive gas generation and corresponding melt pool instability.

The second electron beam 24b has a temporal and spatial pattern which locally and transiently increases the vaporization rate without undesirably increasing the substrate temperature. The secondary electron beam 24b and its scanning pattern may therefore be used to locally increase the temperature of the melt pool 20a without a corresponding increase in pool bulk temperature, or in temperature of the ingot substrate 20b below the secondary beam 24b as it follows its pattern or path. By suitably controlling the beam parameters for the primary and secondary beams 24a and 24b, the convection melt surface velocity may be effectively used for dissipating heat in the melt pool 20a below the traveling secondary beam 24b by convection induced currents which distribute the heat away while returning fresh and lower temperature molten material.

FIG. 3 illustrates schematically the locally induced convection melt surface currents, with the flow currents having a velocity V with a magnitude based on the individual operating parameters of the deposition process. The local increase in vaporization rate disperses additional ingot vapors for improving the deposition rate on the workpiece 12 illustrated in FIG. 1, with the dispersing vapors being illustrated schematically in FIG. 3 by the outwardly projecting arrows. The circulating melt pool 20a below the secondary beam 24b replenishes the molten liquid loss due to vaporization, and thereby prevents the formation of an undesirable crater 26 illustrated in phantom line in FIG. 3. In this way, the secondary beam 24b may travel over the surface of the melt pool 20a for locally increasing the vaporization rate while still maintaining a substantially uniform thickness T of the melt pool 20a. The ingot 20 is conventionally fed for continually providing material for being melted and vaporized in a continuous vaporization process.

Based on the characteristic times associated with the key heat transfer mechanisms described above, a preferred embodiment of the present invention includes a generally wide focus primary scanning pattern for maintaining a fully molten pool and a suitably low substrate temperature to prevent excessive gas generation, while the secondary scanning pattern preferably has a narrower focus less than the beam focus of the primary electron beam which is superimposed on the primary pattern to increase the vaporization rate without raising the substrate temperature. The temporal and spatial pattern characteristics of the secondary scanning pattern preferably do not permit overlapping any more frequently than the heat convection time for dissipating heat across the radius of the secondary beam 24b. For the exemplary 10 mm secondary beam focus, with a 10 mm/second melt surface velocity, the characteristic time is the 1 second ratio thereof, and therefore the secondary scanning pattern preferably has a scanning repetition frequency preferably no faster than about 1 second. In this way, in each cycle of the secondary scanning pattern, the melt pool is locally additionally heated for increasing the vaporization rate, with sufficient heat convection occurring between each cycle for returning each spot within the path of the secondary electron beam back to the bulk temperature of the melt pool before it is again locally heated. As indicated above, the primary beam focus $R_p$ may have a conventional value of about 30 mm, with the secondary beam focus $R_s$ in accordance with one embodiment of the present invention being suitably smaller such as 10 mm.

Since it is desired to limit the additional heat input into the melt pool, the secondary scanning or repetition frequency is preferably less than the scanning frequency of the primary scanning pattern. In the preferred embodiment disclosed above, the primary scanning pattern includes two circular scans operating at 60 Hz and 300 Hz for example, with the secondary scanning frequency being substantially less than the lowest primary frequency of 60 Hz. Based on the characteristic heat convection time in the example disclosed above, the secondary scanning frequency is at least an order of magnitude less than the lowest primary scanning frequency. For example, the secondary scanning frequency is equal to the ratio of the melt surface velocity over the secondary beam focus, e.g. 10 mm/sec divided by 10 mm equals 1 cycle/sec or Hz, which is substantially less than the primary scanning frequencies.

The method flowchart of FIG. 2 indicates that various secondary scanning patterns may be used within the broad principles of locally and transiently increasing vaporization rate without increasing the bulk temperature of the melt pool 20a for maintaining suitable melt pool stability. Exemplary secondary scanning patterns include a concentric circle, radial line, and chordal line patterns illustrated in FIGS. 4–6.

Figure 4:
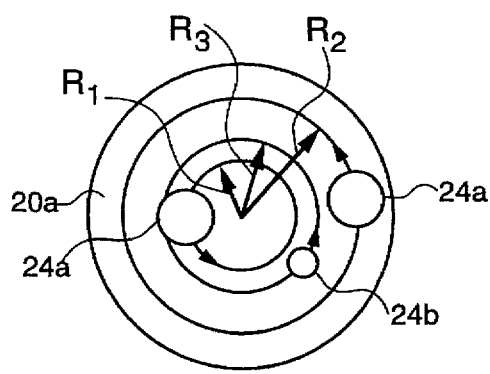
FIG. 4 is a schematic plan view of the top of the ingot illustrated in FIG. 1 showing a primary electron beam scanning pattern, and a secondary electron beam scanning pattern in accordance with one embodiment of the present invention.
Figure 5:
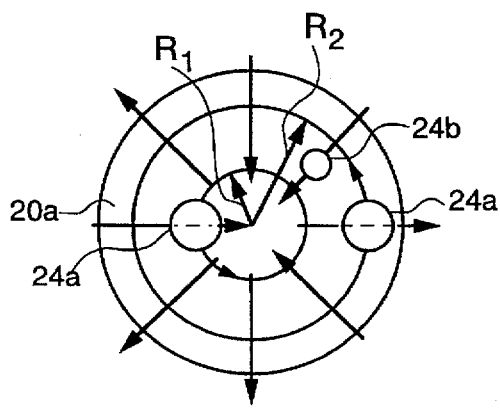
FIG. 5 is a schematic plan view of the top of the ingot illustrated in FIG. 1 showing a primary electron beam scanning pattern, and a secondary electron beam scanning pattern in accordance with a second embodiment of the present invention.
Figure 6:
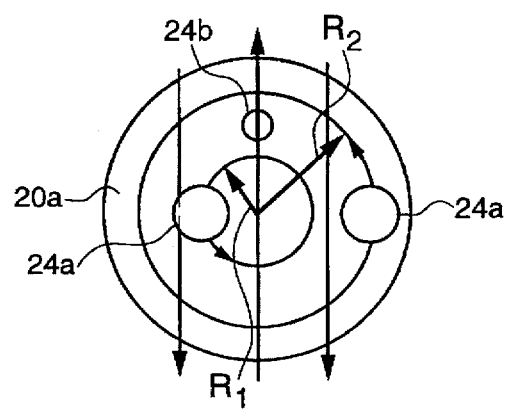
FIG. 6 is a schematic plan view of the top of the ingot illustrated in FIG. 1 showing a primary electron beam scanning pattern, and a secondary electron beam scanning pattern in accordance with a third embodiment of the present invention.

In the three embodiments illustrated in FIGS. 4–6, the primary scanning pattern includes the conventional radially inner and outer concentric scan circles having radii $R_1$ and $R_2$, with each scan circle having a respective inner and outer scanning frequency, with the inner frequency being greater than the outer frequency, e.g. 300 Hz and 60 Hz. In all embodiments illustrated in FIGS. 4–6, the secondary scanning frequency is less than the lowest, or outer scan, frequency, e.g. 1 Hz versus 60 Hz.

In the preferred embodiment illustrated in FIG. 4 the secondary scanning pattern is in the form of an intermediate scan circle disposed radially between the inner and outer scan circles at a third radius $R_3$. The three separate scan circles occur basically contemporaneously at their different scanning frequencies with the corresponding electron beam spots preferably not overlapping each other at any one instance in time. The primary beam 24a preferably has equal radius primary beam focus, $R_p$, for both the inner and outer scan circles, whereas the secondary beam focus $R_s$ is less than the primary beam focus, e.g. 10 mm being less than 30 mm.

In the FIG. 5 second embodiment, the secondary scanning pattern is in the form of a plurality of circumferentially spaced apart radial lines. The secondary beam focus $R_s$ may again have an exemplary value of about 10 mm and a sufficient number of the radial lines are provided for locally maximizing the vaporization rate while preventing an increase in bulk temperature of the melt pool 20a.

In the FIG. 6 third embodiment, the secondary scanning pattern is in the form of a plurality of radially spaced apart and parallel chordal lines. Again, the secondary beam focus $R_s$ may have a value of about 10 mm, with a sufficient number of the chordal lines being provided for maximizing vaporization rate without increasing bulk temperature of the melt pool 20a.

In the three exemplary embodiments illustrated in FIGS. 4–6, the secondary scanning patterns have relatively narrow focus and relatively low scanning frequency, with a time period of about 1 second for example. The secondary scanning pattern may take other suitable forms for locally and transiently maximizing vaporization rate without undesirably increasing the bulk temperature of the melt pool 20a, or the temperature of the underlying substrate 20b, for maintaining an acceptable margin of melt pool stability.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims:

We claim:

1. A method of operating an electron beam physical vapor deposition apparatus including a vacuum chamber containing an ingot disposed in a crucible, a workpiece disposed above said ingot, and an electron beam gun for emitting an electron beam to melt and vaporize said ingot to disperse vapors therefrom for depositing a coating on said workpiece, said method comprising:

directing a primary electron beam with a primary beam focus in a primary scanning pattern across a top surface of said ingot to melt and vaporize said ingot and develop an ingot melt pool floating atop an underlying ingot substrate; and superimposing across said ingot top surface in conjunction with said primary electron beam, a secondary electron beam having a secondary beam focus in a secondary scanning pattern to locally increase vaporization rate of said melt pool.

2. A method according to claim 1 wherein:

said primary beam and scanning pattern are effective to develop said melt pool at a bulk temperature for maintaining stability of said melt pool; and said secondary beam and scanning pattern are effective to develop additional heat flux into said melt pool at a lower rate than heat flux is dissipated therefrom to transiently increase temperature and vaporization rate in said melt pool along said secondary scanning pattern.

3. A method according to claim 2 wherein said secondary beam and scanning pattern are effective to locally increase temperature of said melt pool without a corresponding increase in temperature of said ingot substrate below said secondary beam.

4. A method according to claim 2 wherein said secondary beam focus is less than said primary beam focus.

5. A method according to claim 2 wherein said secondary scanning pattern has a scanning frequency less than a scanning frequency of said primary scanning pattern.

6. A method according to claim 5 wherein said melt pool has a convection melt surface velocity for dissipating heat, and said secondary scanning frequency is less than about the ratio of said melt surface velocity over said secondary beam focus.

7. A method according to claim 5 wherein said secondary scanning frequency is at least an order of magnitude less than said primary scanning frequency.

8. A method according to claim 5 wherein:

said primary scanning pattern comprises radially inner and outer concentric scan circles having respective inner and outer scanning frequencies; and said secondary frequency is less than each of said primary frequencies.

9. A method according to claim 8 wherein said secondary scanning pattern comprises an intermediate scan circle disposed radially between said inner and outer scan circles.

10. A method according to claim 8 wherein said primary beam has equal radius primary beam focus for both said inner and outer scan circles, and said secondary beam focus is less than said primary beam focus.

11. A method according to claim 8 wherein said secondary scanning pattern comprises a plurality of circumferentially spaced apart radial lines.

12. A method according to claim 8 wherein said secondary scanning pattern comprises a plurality of radially spaced apart and parallel chordal lines.

* * * * *